US008946024B2

(12) United States Patent
Lee

(10) Patent No.: US 8,946,024 B2
(45) Date of Patent: Feb. 3, 2015

(54) NONVOLATILE MEMORY DEVICE AND METHOD FOR FABRICATING THE SAME

(71) Applicant: SK Hynix Inc., Gyeonggi-do (KR)

(72) Inventor: Nam-Jae Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/323,834

(22) Filed: Jul. 3, 2014

(65) Prior Publication Data
US 2014/0322875 A1 Oct. 30, 2014

Related U.S. Application Data

(62) Division of application No. 13/331,460, filed on Dec. 20, 2011, now Pat. No. 8,803,218.

(30) Foreign Application Priority Data

May 24, 2011 (KR) ........................ 10-2011-0049239

(51) Int. Cl.
H01L 27/115 (2006.01)
H01L 21/762 (2006.01)
H01L 29/423 (2006.01)

(52) U.S. Cl.
CPC .... H01L 27/11551 (2013.01); H01L 27/11521 (2013.01); H01L 21/76229 (2013.01); H01L 29/42324 (2013.01)
USPC ........... 438/264; 438/201; 438/594; 438/211; 438/424; 257/321; 257/316; 257/E21.546

(58) Field of Classification Search
CPC .................. H01L 21/76229; H01L 27/11521; H01L 29/7881; H01L 29/42336; H01L 29/42328
USPC .......... 438/427, 424, 594, 201, 211; 257/321, 257/E21.546, E21.209
See application file for complete search history.

(56) References Cited

U.S. PATENT DOCUMENTS

| 6,969,653 | B2 | 11/2005 | Jwa | |
|---|---|---|---|---|
| 7,573,089 | B2 * | 8/2009 | Kim et al. | 257/314 |
| 2007/0264775 | A1 * | 11/2007 | Kim et al. | 438/257 |
| 2010/0252875 | A1 * | 10/2010 | Shirota | 257/321 |

OTHER PUBLICATIONS

Office Action issued by the USPTO for another divisional U.S. Appl. No. 14/323,860 of the parent U.S. Appl. No. 13/331,460 on Dec. 5, 2014.

* cited by examiner

Primary Examiner — Thinh T Nguyen
(74) Attorney, Agent, or Firm — IP&T Group LLP

(57) ABSTRACT

A nonvolatile memory device includes a floating gate formed over a semiconductor substrate, an insulator formed on a first sidewall of the floating gate, a dielectric layer formed on a second sidewall and an upper surface of the floating gate, and a control gate formed over the dielectric layer.

6 Claims, 7 Drawing Sheets

NONVOLATILE MEMORY DEVICE AND METHOD FOR FABRICATING THE SAME

CROSS-REFERENCE TO RELATED APPLICATIONS

This application is a division of U.S. patent application Ser. No. 13/331,460 filed on Dec. 20, 2011, which claims priority of Korean Patent Application No. 10-2011-0049239, filed on May 24, 2011. The disclosure of each of the foregoing application is incorporated herein by reference in its entirety.

BACKGROUND

1. Field

Exemplary embodiments of the present invention relate to a method for fabricating a semiconductor device, and more particularly, to a nonvolatile memory device and a method for fabricating the same.

2. Description of the Related Art

In order to realize high integration, a NAND flash memory, which is a nonvolatile memory device, includes a plurality of cells, which are coupled in series to form a unit string. NAND flash memories are capable of substituting a memory stick, a USB driver, and a hard disk.

During a fabrication process of the NAND flash memory, a self aligned-shallow trench isolation (SA-STI) process or advanced self aligned-shallow trench isolation (ASA-STI) process is applied to realize element isolation and form a floating gate.

FIG. 1 is a diagram illustrating a conventional nonvolatile memory device.

Referring to FIG. 1, a plurality of active regions 13 isolated by a plurality of trenches 12 are formed in a substrate 11. A tunnel isolation layer 14 is formed on each of the active regions 13, and a floating gate 15 is formed on the tunnel isolation layer 14. An isolation layer 16 is buried in each of the trenches 12, and the upper surface of the isolation layer 16 is positioned lower than the upper surface of the floating gate 15. A dielectric layer 17 is formed on the entire surface of the resultant structure including the floating gate 15 and the isolation layer 16. The dielectric layer 17 has an oxide-nitride-oxide (ONO) structure including an oxide 17A, a nitride 17B, and an oxide 17C. A control gate 18 is formed on the dielectric layer 17.

In FIG. 1, the plurality of trenches 12 for isolating the plurality of active regions 13 are spaced at even intervals from each other. The floating gate 15 has both sidewalls contacted with the dielectric layer 17, and the control gate 18 is formed over the dielectric layer 17 both above and between the floating gates 15.

As the NAND flash memory is highly integrated, a 20-nm class NAND flash memory may employ symmetrical floating gates. More specifically, as illustrated in FIG. 1, spaces S1 to S3 are equal to each other (S1=S2=S3), and both sidewalls of the floating gate 16 contact the dielectric layer 17.

In the conventional nonvolatile memory device, however, since the space between the floating gates 15 is small, securing a physical space where the control gate 18 is to be formed after the dielectric layer 17 is deposited is difficult.

To secure the physical space for the control gate 18, the critical dimension (CD) of the active region 13 may be reduced to increase the CD of the trench 12 and the space between the floating gates 15. However, since the spaces between the respective floating gates 15 are equal in size, it is not easy to secure the physical space. Therefore, using the floating gate 15 may be limited.

SUMMARY

An embodiment of the present invention is directed to a nonvolatile memory device capable of sufficiently securing a physical space where a control gate is to be formed by asymmetrically controlling spaces between floating gates, and a method for fabricating the same.

Another embodiment of the present invention is directed to a nonvolatile memory device capable of securing a coupling ratio, and a method for fabricating the same.

In accordance with an embodiment of the present invention, a nonvolatile memory device includes: a floating gate formed over a semiconductor substrate; an insulator formed on a first sidewall of the floating gate; a dielectric layer formed on a second sidewall and an upper surface of the floating gate; and a control gate formed over the dielectric layer.

In accordance with another embodiment of the present invention, a nonvolatile memory device includes: a plurality of floating gates formed over a substrate and isolated from each other by a first trench and a second trench that are alternately provided between the plurality of floating gates, wherein the second trench having a smaller width than the first trench; a first isolation layer to partially gap-fill the first trench; a second isolation layer gap-filling the second trench; a dielectric layer formed on the entire surface of the semiconductor substrate including the first and second isolation layers and the floating gates; and a control gate formed over the dielectric layer to gap-fill the first trench.

In accordance with yet another embodiment of the present invention, a method for fabricating a nonvolatile memory device includes: forming a plurality of first conductive layer patterns over a semiconductor substrate such that the first conductive layer patterns are isolated from each other by a first trench and a second trench that are alternately provided between the plurality of first conductive layer patterns, wherein the second trench having a smaller width than the first trench; forming a first isolation layer to partially gap-fill the first trench and a second isolation layer gap-filling the second trench; and forming a plurality of floating gate by etching the first conductive patterns; forming a dielectric layer over the entire surface of the resultant structure including the first and second isolation layers and the floating gates; forming a second conductive layer over the dielectric layer; and forming a control gate by etching the second conductive layer.

In accordance with still another embodiment of the present invention, a method for fabricating a nonvolatile memory device includes: forming a first and a second trench by etching a semiconductor substrate; forming a plurality of first conductive layer patterns over the semiconductor substrate such that the first conductive layer patterns are isolated from each other by a first trench and a second trench that are alternately provided between the plurality of first conductive layer patterns, wherein the second trench having a smaller width than the first trench; forming a first isolation layer that is recessed to partially gap-fill the first trench, and a second isolation layer which gap-fills the second trench; forming a plurality of floating gate by etching the first conductive patterns; forming a dielectric layer over the entire surface of the resultant structure including the first and second isolation layers and the floating gates; forming a second conductive layer over the dielectric layer; and forming a control gate by etching the second conductive layer.

BRIEF DESCRIPTION OF THE DRAWINGS

FIGS. 3A to 3I are diagrams illustrating a method for fabricating a nonvolatile memory device in accordance with the embodiment of the present invention.

DETAILED DESCRIPTION

Figure 1:
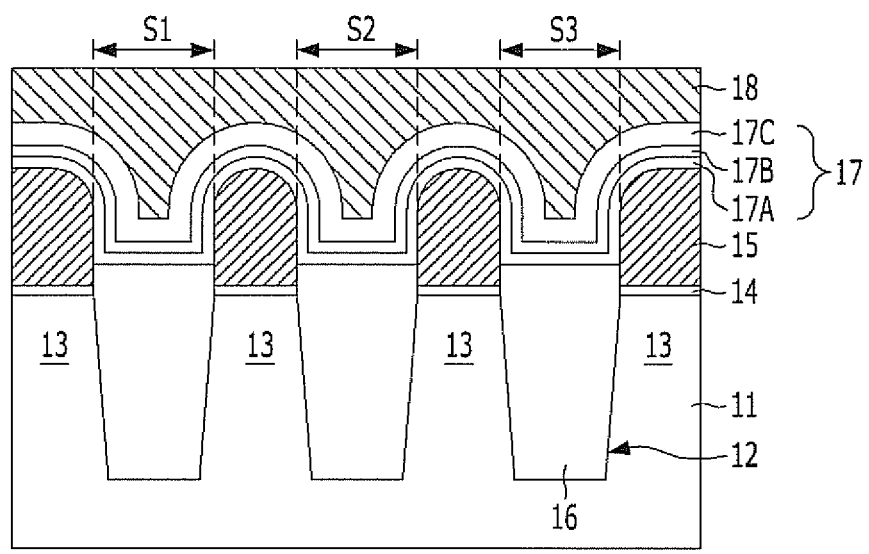
FIG. 1 is a diagram illustrating a conventional nonvolatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In the embodiments of the present invention, when trenches for isolation are formed, floating gates are formed to have an asymmetrical structure. Therefore, after the floating gates are formed, a dielectric layer is formed on one sidewall of each of the floating gates to secure a coupling ratio. A reduction in surface area caused by the use of one surface may be compensated by enlarging the height of the floating gate.

Furthermore, as an increase in interference caused by mutual interference between the floating gates is reduced by a design change or the like, a physical limit of the floating gate may be overcome.

Figure 2A:
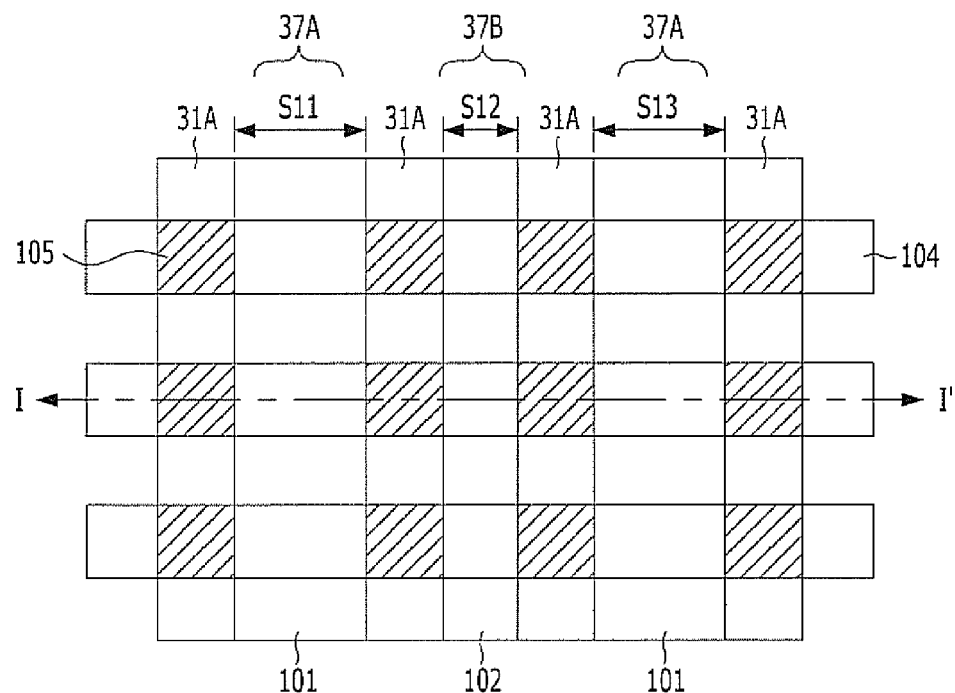
FIG. 2A is a diagram illustrating a nonvolatile memory device in accordance with an embodiment of the present invention.
Figure 2B:
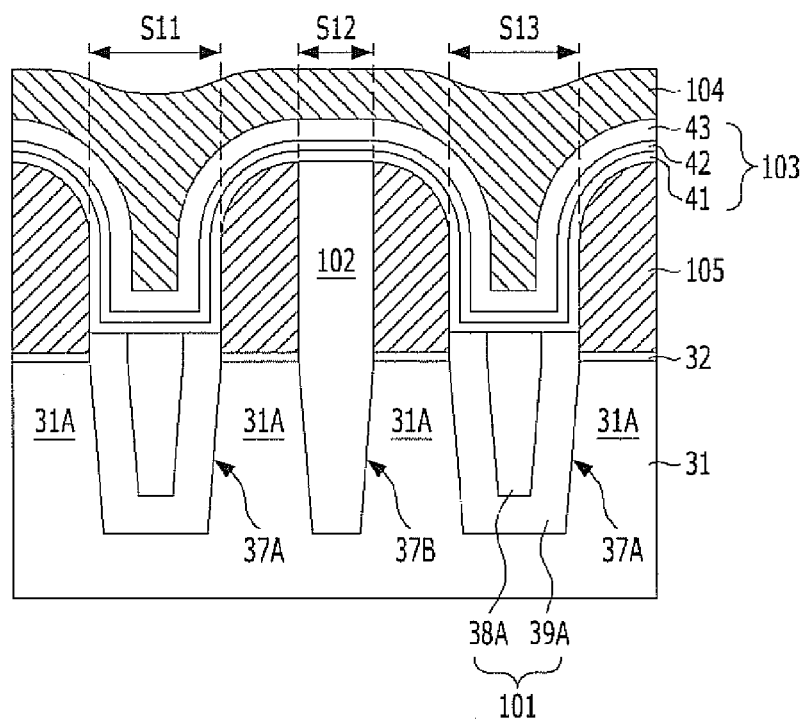
FIG. 2B is a cross-sectional view taken along a line I-I' of FIG. 2A.

FIG. 2A is a diagram illustrating a nonvolatile memory device in accordance with an embodiment of the present invention. FIG. 2B is a cross-sectional view taken along a line I-I' of FIG. 2A.

Referring to FIGS. 2A and 2B, a plurality of active regions 31A are formed in a substrate 31. The plurality of active regions 31A have the same CD. The active regions 31A are isolated by a plurality of trenches 37A and 37B. The plurality of trenches includes first trenches 37A and second trenches 37B that are alternately formed. The CD of the first trench 37A is different from the CD of the second trench 37B. For example, the first trenches 37A have first and second spaces S11 and S13 which are equal to each other. The second trenches 37B have a second space S12 that is smaller than the first and third spaces S11 and S13. Therefore, the first trench 37A has a larger CD than the second trench 37B. The spaces S11 and S13 are larger than the spaces S1 and S3 in the conventional nonvolatile memory device, and the second space S12 is smaller than the space S2 in the conventional nonvolatile memory device. As a result, the entire area of a cell array region is not changed, but the spaces between floating gates 105 are adjusted.

Inside the first and second trenches 37A and 37B, isolation layers are formed. Specifically, a first isolation layer 101 is formed in the first trenches 37A, and a second isolation layer 102 is formed in the second trench 37B. The height of the second isolation layer 102 is higher than the height of the first isolation layer 101. More specifically, the first isolation layer 101 has a recessed surface.

A tunnel insulation layer 32 and a floating gate 105 are stacked on each of the active regions 31A. Since the floating gate 105 is formed in correspondence to each of the active regions 31A, a plurality of floating gates 105 are formed. The tunnel insulation layer 32 is formed of oxide, for example, silicon oxide ($SiO_2$). Furthermore, after the silicon oxide that forms the tunnel insulation layer 32 is formed, a heat treatment process using nitrogen ($N_2$) gas may be performed to form a nitride layer at the interface between the silicon oxide and the active region 31A. In addition, the tunnel insulation layer 32 may be formed of metal oxide such as aluminum oxide ($Al_2O_3$), zirconium oxide ($ZrO_2$), or hafnium oxide ($HfO_2$), which has a dielectric constant of 3.9 or more, or a mixed or stacked layer thereof. The floating gate 105 may be formed of any conductive material, for example, any one material selected from a polycrystalline silicon layer, a transition metal, and a rare-earth metal. For example, the polycrystalline silicon layer may include an un-doped polycrystalline silicon layer or impurity-doped polycrystalline silicon layer. If the floating gate 105 is an un-doped silicon layer, ion impurities are separately implanted through a subsequent ion implantation process. The transition metal may include Fe, Co, W, Ni, Pd, Pt, Mo, or Ti, and the rare-earth metal may include Er, Yb, Sm, Y, La, Ce, Tb, Dy, Ho, Tm, or Lu.

The plurality of floating gates 105 have the same CD, but the spaces provided alternately between the plurality of floating gates 105 have different CD's. For example, a space (S12) between the floating gates 105 isolated by the second isolation layer 102 is smaller than a space (S11 or S13) between the floating gates 105 isolated by the first isolation layer 101. The first trench 37A is formed to be aligned with one sidewall of the floating gate 105, and the second trench 37B is formed to be aligned with the other sidewall of the floating gate 105. The second isolation layer 102 is formed at the other sidewall of the floating gate 105 while gap-filling the second trench 37B.

A dielectric layer 103 is formed on the entire surface of the resultant structure including the floating gates 105. The dielectric layer 103 has an ONO structure. In the ONO structure an oxide 41, a nitride 42, and an oxide 43 are sequentially stacked. The dielectric layer 103 may be formed of metal oxide such as aluminum oxide ($Al_2O_3$), zirconium oxide ($ZrO_2$), or hafnium oxide ($HfO_2$), which has a higher dielectric constant than that of silicon oxide, or a stacked layer or mixed layer thereof.

A control gate 104 is formed on the dielectric layer 103. The control gate 104 may be formed of a conductive material. Desirably, the control gate 104 may be formed of the same material as the floating gate 105. Although not illustrated, a low-resistance metal layer may be formed on the control gate 104 to reduce the resistance of the control gate 104. The low-resistance metal layer includes a metal nitride layer, a metal silicide layer, or a stacked layer thereof. For example, the metal nitride layer may include tungsten nitride (WN), and the metal silicide layer may include a tungsten silicide layer ($WSi_2$).

According to the above descriptions, each of the floating gates 105 is contacted with the dielectric layer 103 through one sidewall. In other words, each floating gate 105 contacts the dielectric layer 103 through, for example one sidewall. The floating gates 105 contact the dielectric layer 103 through one sidewall because the second space S12 is smaller than the first and third spaces S11 and S13 and the second isolation layer 102 gap-fills the trench 37B to the surface of the floating gates. Therefore, the dielectric layer 103 is not formed between the floating gates 105 above the second trenches 37B, but formed only between the floating gates 105 above the first trenches 37A. The first isolation layer 101 has a shorter height than the second isolation layer 102, and the first and third spaces S11 and S13 are larger than the second space S12. Therefore, the dielectric layer 103 is formed along the step profile. Furthermore, since the first and third spaces S11 and S13 are larger than the second space S12, the control gate 104 is formed on the dielectric layer 103 in the first and third spaces S11 and S13.

In the nonvolatile memory device in accordance with the embodiment of the present invention, the spaces between the respective floating gates 105 are adjusted asymmetrically, as illustrated in FIGS. 2A and 2B. Therefore, a physical space to form the control gate 104 may be secured.

FIGS. 3A to 3I are diagrams illustrating a method for fabricating a nonvolatile memory device in accordance with the embodiment of the present invention. FIGS. 3A to 3I are cross-sectional views taken along a line I-I' of FIG. 2A.

Figure 3A:
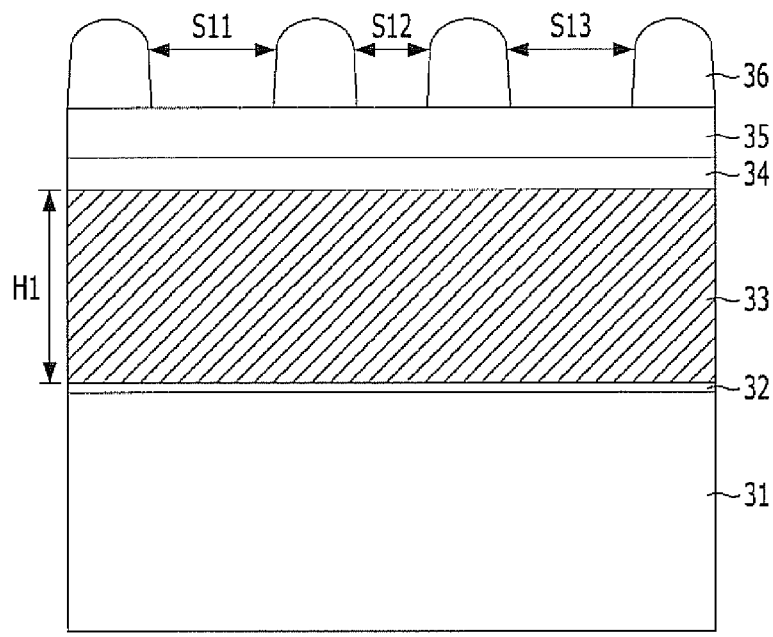

Referring to FIG. 3A, a tunnel insulation layer 32 is formed on a semiconductor substrate 31. The tunnel insulation layer 32 is formed of oxide, for example, silicon oxide ($SiO_2$). Furthermore, after the tunnel insulation layer 32 formed of silicon oxide is formed, a heat treatment process using nitrogen ($N_2$) gas may be performed to form a nitride layer at the interface between the silicon oxide and the semiconductor substrate 31. In addition, the tunnel insulation layer 32 may be formed of metal oxide such as aluminum oxide ($Al_2O_3$), zirconium oxide ($ZrO_2$), or hafnium oxide ($HfO_2$), or a mixed or stacked layer thereof, which has a dielectric constant of 3.9 or more. The tunnel insulation layer 32 may be fabricated by using a dry oxidation process, a wet oxidation process, or an oxidation process using radical ions. The tunnel insulation layer 32 may be formed to a thickness of 50 to 100 Å.

A first conductive layer 33 is formed on the tunnel insulation layer 32. The first conductive layer 33 may be formed of any conductive material, for example, any one material selected from a polycrystalline silicon layer, a transition metal, and a rare-earth metal. For example, the conductive layer 33 may be formed of the polycrystalline silicon layer, and the polysilicon layer may include an un-doped polycrystalline silicon layer or impurity-doped polycrystalline silicon layer. In the case of the un-doped silicon layer, ion impurities are separately implanted through a subsequent ion implantation process. The polycrystalline silicon layer may be formed by a low pressure chemical vapor deposition (LPCVD) process. If the polycrystalline silicon layer is used as the conductive layer 33 and the polycrystalline silicon layer is formed through LPCVD, silane ($SiH_4$) gas is used as source gas, and phosphine ($PH_3$) or arsine ($AsH_3$) is used as doping gas. The transition metal may include Fe, Co, W, Ni, Pd, Pt, Mo, or Ti, and the rare-earth metal may include Er, Yb, Sm, Y, La, Ce, Tb, Dy, Ho, Tm, or Lu.

The first conductive layer 33 is used to form a floating gate. The first conductive layer 33 is formed to a thickness H1, which is higher than the height of the floating gate 15 in the conventional nonvolatile memory device (refer to FIG. 1). This structure may compensate for a reduction in coupling ratio that is caused when only one sidewall of a floating gate is contacted with a dielectric layer.

A pad layer 34 and a hard mask layer 35 are stacked on the first conductive layer 33. The pad layer 34 includes a nitride layer such as silicon nitride ($Si_3N_4$), and the hard mask layer 35 includes an oxide layer such as silicon oxide ($SiO_2$).

A first photoresist pattern 36 is formed on the hard mask layer 35. The first photoresist pattern 36 is referred to as an ISO mask (isolation mask) for an STI process. The first photoresist pattern 36 includes a line and space pattern. Therefore, the first photoresist pattern 36 has designated spaces, for example, first to third spaces S11 to S13. The first space S11 is equal to the third space S13, and the second space S12 is smaller than the first and third spaces S11 and S13.

Figure 3B:
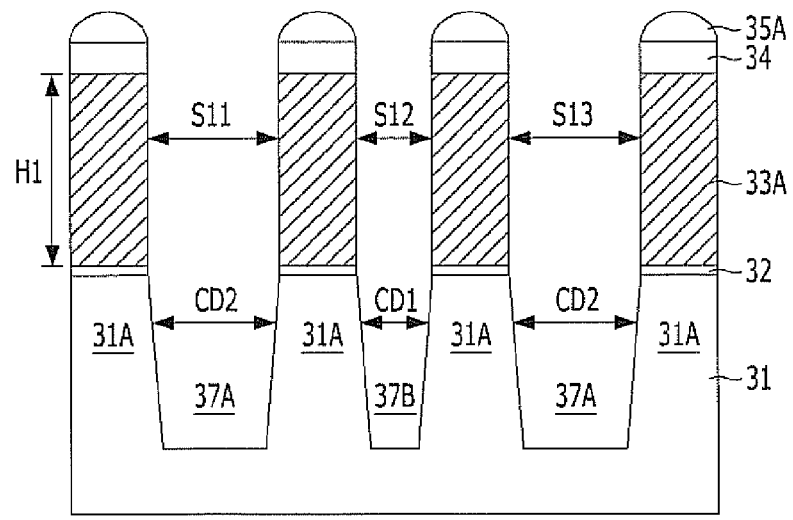

Referring to FIG. 3B, an STI etching process is performed. More specifically, the hard mask layer 35, the pad layer 34, the first conductive layer 33, and the tunnel insulation layer 32 are sequentially etched using the first photoresist pattern 36 as an etching barrier, and the semiconductor substrate 31 is etched to a designated depth. Accordingly, first and second trenches 37A and 37B are formed in the semiconductor substrate 31. The first photoresist pattern 36 shapes the first and second trenches 37A and 37B (refer to FIG. 3A). Thus, the first trench 37A has a CD CD2 corresponding to the first or third space S11 or S13 of the first photoresist pattern, and the second trench 37B has a CD CD1 corresponding to the second space S12. Since the first and third spaces S11 and S13 have the same CD and the second space S12 is smaller than the first and third spaces S11 and S13, the first and second trenches 37A and 37B are alternately formed with the first or third space S11 or S13 and the second space S12 provided alternatively.

After the first and second trenches 37A and 37B are formed, the first photoresist pattern 36 may be removed, and the hard mask pattern 35A serves as an etching barrier. Using the hard mask patter 35A as an etch barrier, the depth and widths of the first and second trenches 37A and 37B may be properly controlled depending on isolation characteristics. Accordingly, a plurality of active regions 31A are defined. The active regions 31A have the same CD. The plurality of active regions 31A are isolated by the first and second trenches 37A and 37B.

Desirably, the CD CD2 of the first trench 37A may be larger than the CD CD1 of the second trench 37B. Furthermore, the spaces between adjacent first conductive layer patterns 33A may differ in correspondence to the CDs of the first and second trenches 37A and 37B. For example, the space S12 between the first conductive layer patterns 33A corresponding to the CD of the second trench 37B is smaller than the space S11 or S13 between the first conductive layer patterns 33A corresponding to the CD of the first trench 37A.

After etching to form the first and second trenches 37A and 37B, the plurality of first conductive layer patterns 33A are formed. The plurality of first conductive layer patterns 33A have the first to third spaces S11, S12, and S13 between the plurality of first conductive layer patterns 33A. The plurality of first conductive layer patterns 33A are used as floating gates.

Figure 3C:
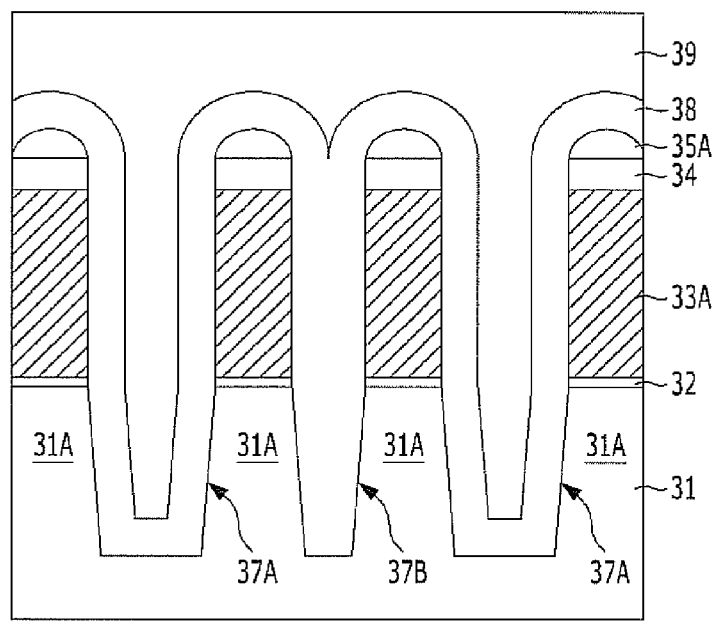

Referring to FIG. 3C, an insulator for isolation is formed. The insulator may include first and second insulators 38 and 39 that are sequentially formed. The first and second insulators 38 and 39 include oxide. The first insulator 38 may serve as a liner layer. Before the first insulator 38 is formed, a sidewall oxidation process, which is not illustrated, may be performed. The first insulator 38 includes silicon oxide ($SiO_2$). The first insulator 38 is formed over the entire surface of the semiconductor substrate 31 including the first and second trenches 37A and 37B and the first hard mask layer 35. The first insulator 38 may be formed to at least such a thickness as to gap-fill the second trench 37B. Accordingly, the second trench 37B is completely gap-filled with the first insulator 38, but the first trench 37A is not gap-filled because the first trench 37A has a larger CD than the second trench 37B. The second insulator 39 may include an un-doped silicate glass layer (hereafter, referred to HDP layer) formed by using a high density plasma-chemical vapor deposition (HDP-CVD) process, or a stacked layer of an HDP layer and a spin-on-dielectric (SOD) layer. The HDP layer has an excellent burial property, even at a high aspect ratio. The SOD layer may include a polysilazane (PSZ) layer. In this embodiment, it is assumed that the PSZ layer is used.

In another embodiment, when a liner layer is not required, one insulator may be used to gap-fill the first and second trenches 37A and 37B at once. In this embodiment, the second insulator 39 may be used to gap-fill the first and second trenches 37A and 37B at once.

Figure 3D:
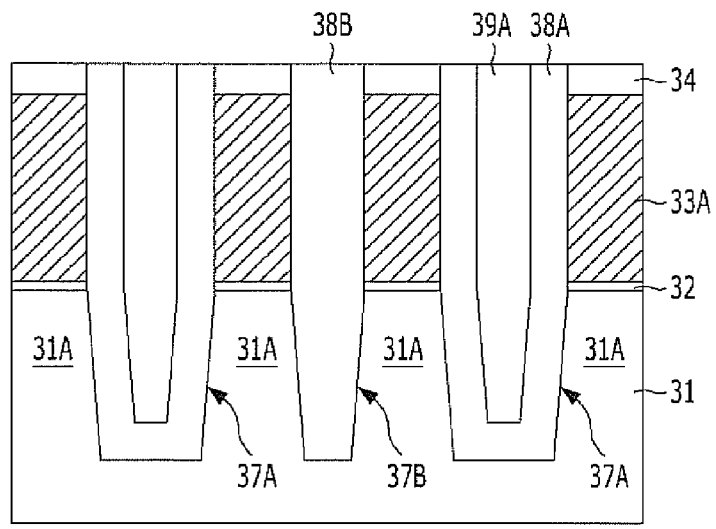

Referring to FIG. 3D, the first and second insulators 38 and 39 are planarized. The planarization process may be performed by an etching process (for example, etch-back process) using plasma etch equipment or a chemical mechanical polishing (CMP) process. In this embodiment, the CMP process may be used to planarize the first and second insulators 38 and 39 until the pad layer 34 is exposed. The pad layer 34 serves as a polishing stop layer.

Through the planarization process, first and second insulator patterns 38A and 39A are formed. The first and second insulator patterns 38A and 39A gap-fill the inside of the first trench 37A. In other words, the first and second insulator patterns 38A and 39A gap-fill the first or third space between the first conductive layer patterns 33A. Meanwhile, for example, only the first insulator pattern 38B remains in the second trench 37B. In other words, only the first insulator pattern 38B remains between the first conductive layer patterns 33A at the upper portion of the second trench 37B, more specifically, in the second space S12.

Figure 3E:
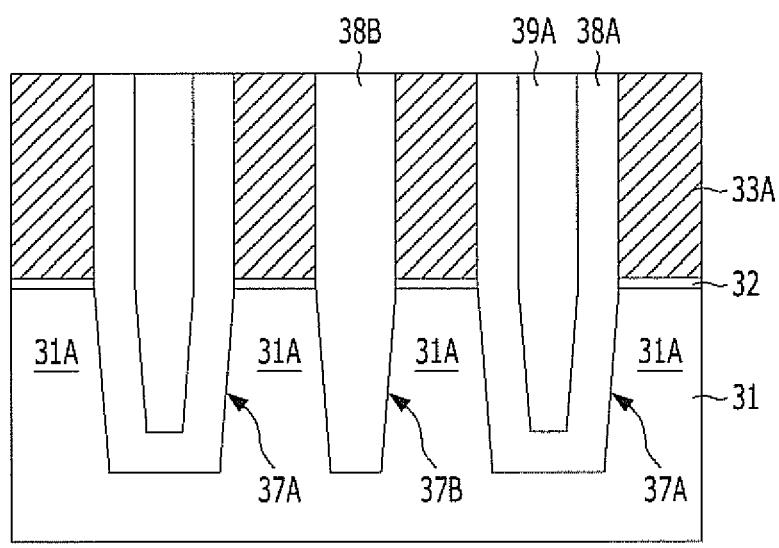

Referring to FIG. 3E, the pad layer 34 is removed. The pad layer 34 is removed by using wet etching or dry etching. Desirably, wet etching may be used to remove the pad layer 34. When the pad layer 34 is formed of nitride, a phosphoric acid ($H_3PO_4$) solution may be used to remove the pad layer 34.

When the pad layer 34 is removed, the first and second insulator patterns 38A, 39A, and 39B may be partially removed.

Referring to FIG. 3F, the first and second insulator patterns 38A and 39A are partially recessed to form a first isolation layer 101, which is recessed to a designated depth inside the first trench 37A. The first isolation layer 101 includes the first and second insulator patterns 38A and 39A.

The recess process is performed to control an effective field oxide height (EFH). In order to perform the recess process, for example, only on a cell region, a second photoresist pattern (referred to as PCL mask) 40 is used as an etching barrier. The second photoresist pattern 40 serves to close a peripheral circuit region, which is not illustrated, and open only the cell region. Furthermore, the second photoresist pattern 40 may be formed in the cell region so that the second insulator pattern 39B is not recessed by the recess process. More specifically, the second insulator pattern 39B between the first conductive layer patterns 33A having a small space (S2) is closed, and the first and second insulator patterns 38A and 39A between the first conductive layer patterns 33A having a large space (S1 and S3) are opened. The recess process is performed by a wet etching or dry etching process.

Through the recess process, the upper surface of the first isolation layer 101 is positioned at a height of 350~400 Å from the semiconductor substrate, more specifically, the upper surface of the active region 31A. Furthermore, an upper corner of the first conductive layer pattern 33A may be rounded by the recess process. One corner of each of the first conductive layer patterns 33A is rounded because one sidewall of each of the first conductive layer patterns 33A is exposed by the recess process.

Meanwhile, the second insulator pattern 39B remaining in the second trench 37B is referred to as a second isolation layer 102.

Figure 3G:
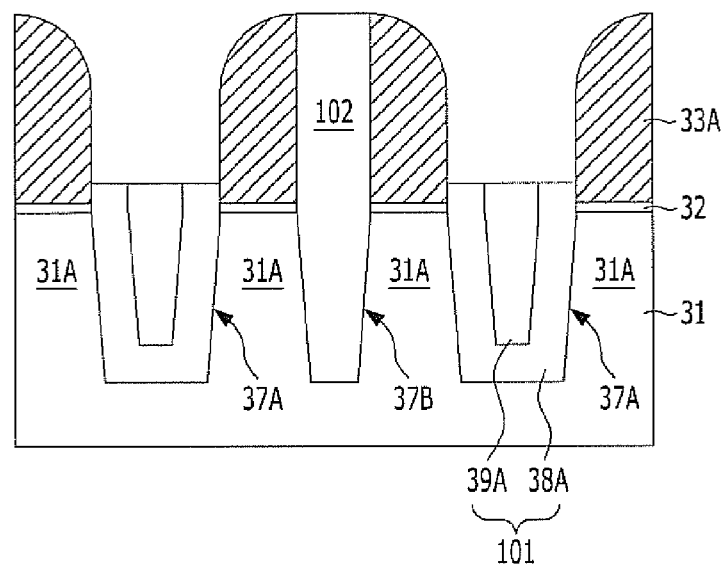

Referring to FIG. 3G, the second photoresist pattern 40 is stripped, and a cleaning process is then performed.

When the second photoresist pattern 40 is stripped, the plurality of first conductive layer patterns 33A have one sidewall thereof is exposed. The first conductive layer patterns 33A adjacent with the first or third space S1 or S3 have one sidewall exposed after recessing the first isolation layer 101. Furthermore, the other sidewall of the first conductive patterns 33A is not exposed because the second isolation layer 102 is not recessed.

As a result, the plurality of first conductive layer patterns 33A are formed with the first or third space S11 or S12 and the second space S12, which are alternately provided between the plurality of first conductive patters 33A.

Figure 3H:
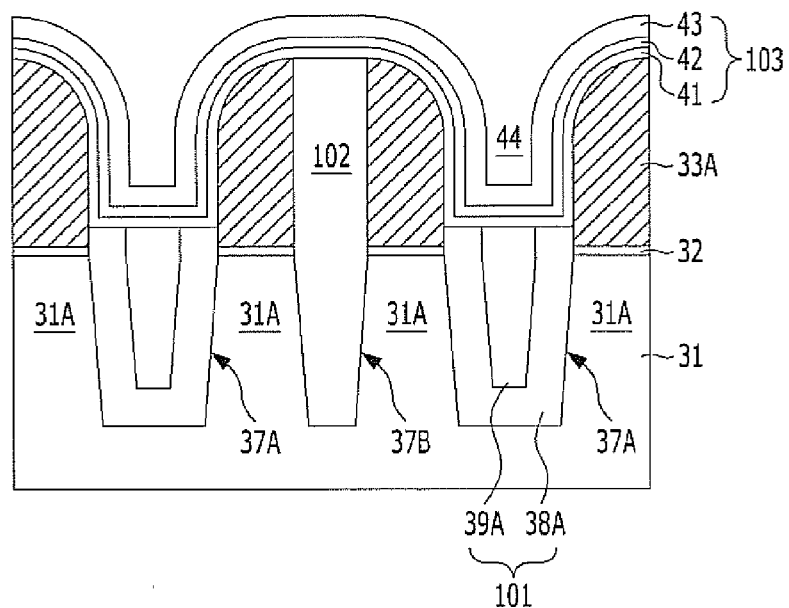

Referring to FIG. 3H, a dielectric layer 103 is formed on the entire surface of the resultant structure including the first and second isolation layers 101 and 102 and the first conductive layer patterns 33A. At this time, the dielectric layer 103 has an ONO structure. The ONO structure sequentially stacks an oxide 41, a nitride 42, and an oxide 43. In addition, the dielectric layer 103 may be formed of metal oxide such as aluminum oxide ($Al_2O_3$), zirconium oxide ($ZrO_2$), or hafnium oxide ($HfO_2$), which has a higher dielectric constant than that of silicon oxide, or a stacked layer or mixed layer thereof.

When the dielectric layer 103 is formed in such a manner, a designated gap 44 may be secured in the first and third spaces. This structure may be formed because the first and third spaces are larger than the second space. Meanwhile, since the dielectric layer 103 is not formed in the second space, the dielectric layer 103 is in contact with one sidewall of each of the plurality of first conductive layer pattern 33A.

Figure 3I:
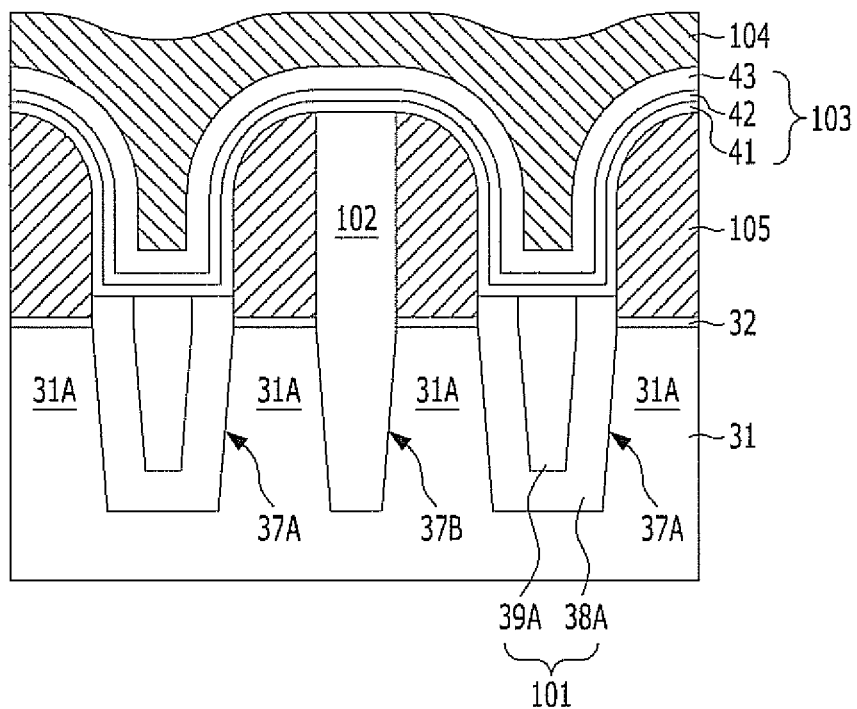

Referring to FIG. 3I, a second conductive layer to be used as a control gate 104 is formed on the dielectric layer 103. At this time, the second conductive layer may be formed of a conductive material. According to an example, the second conductive layer may be formed of the same material as the first conductive layer pattern 33A. Although not illustrated, a low-resistance metal layer may be formed on the second conductive layer to reduce the resistance of the control gate. The low-resistance metal layer may include a metal nitride layer, a metal silicide layer, or a stacked layer thereof. For example, the metal nitride layer may include tungsten nitride (WN), and the metal silicide layer may include tungsten silicide ($WSi_2$).

Although not illustrated, a gate etching process is subsequently performed. More specifically, the second conductive layer is etched in a line type extended in any one direction to form the control gate 104, and the dielectric layer 103 and the first conductive layer pattern 33A under the control gate 104 are etched. Accordingly, as illustrated in FIGS. 2A and 2B, the nonvolatile memory device has a plane structure where the plurality of floating gates 105 are arranged under the control gate 104. The plurality of floating gates 105 becomes single side floating gates (FG) that have one sidewall contacted with the dielectric layer 103.

According to the above descriptions, as the spaces between the floating gates 105 are formed asymmetrically, a physical limit of the floating gates 105 may be overcome. More specifically, after the dielectric layer 103 is deposited, a physical space where the control gate 104 is to be formed may be sufficiently secured in the space between the floating gates 105 corresponding to the first or third space.

Furthermore, since the recess process of the isolation layer 101 is performed in a state where a wide space is provided, the EFH may be controlled.

In accordance with the embodiments of the present invention, the spaces between the floating gates may be asymmetrically formed to overcome a physical limit of the floating gates. Therefore, a NAND type flash memory using floating gates even in a 10 nm class flash memory field may be fabricated.

Furthermore, since the EFH is easy to control in a state where a wide space is provided, the uniformity of device characteristics may be improved depending on an EFH variation.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a nonvolatile memory device, comprising:
    forming a plurality of first conductive layer patterns over a semiconductor substrate such that the first conductive layer patterns are isolated from each other by a first trench and a second trench that are alternately provided between the plurality of first conductive layer patterns, wherein the second trench having a smaller width than the first trench;
    forming a first isolation layer to partially gap-fill the first trench and a second isolation layer gap-filling the second trench;
    forming a plurality of floating gates by etching the first conductive patterns;
    forming a dielectric layer over the entire surface of the resultant structure including the first and second isolation layers and the floating gates;
    forming a second conductive layer over the dielectric layer; and
    forming a control gate by etching the second conductive layer,
    wherein the plurality of floating gates have the same critical dimension, and spaces, which are alternately provided between the plurality of floating gates, have different critical dimension.

2. The method of claim 1, wherein the forming of the first isolation layer and the second isolation layer comprises:
    forming an insulator over the entire surface of the semiconductor substrate to gap-fill the first and second trenches;
    planarizing the insulator until upper surfaces of the first conductive layer patterns are exposed;
    forming a mask pattern to close the second trench; and
    recessing the insulator gap-filling the first trench by using the mask pattern as an etching barrier.

3. The method of claim 1, wherein the first and second isolation layers comprises an oxide layer.

4. The method of claim 1, wherein the dielectric layer has an ONO structure, with sequentially stacked oxide layer, nitride layer, and oxide layer.

5. The method of claim 1, wherein the forming of the plurality of first conductive layer patterns comprises:
    forming a tunnel insulation layer, a first conductive layer, a pad layer, and a hard mask layer over the semiconductor substrate;
    forming a photoresist pattern over the hard mask layer, the photoresist pattern defining the first and second trenches; and
    etching the hard mask layer, the pad layer, the first conductive layer, and the tunnel insulation layer by using the photoresist pattern as an etching barrier.

6. A method for fabricating a nonvolatile memory device, comprising:
    forming a plurality of first conductive layer patterns over a semiconductor substrate such that the first conductive layer patterns are isolated from each other by a first trench and a second trench that are alternately provided between the plurality of first conductive layer patterns, wherein the second trench having a smaller width than the first trench;
    forming a first isolation layer to partially gap-fill the first trench and a second isolation layer gap-filling the second trench;
    forming a plurality of floating gates by etching the first conductive patterns;
    forming a dielectric layer over the entire surface of the resultant structure including the first and second isolation layers and the floating gates;
    forming a second conductive layer over the dielectric layer; and
    forming a control gate by etching the second conductive layer,
    wherein the forming of the first isolation layer and the second isolation layer comprises:
        forming an insulator over the entire surface of the semiconductor substrate to gap-fill the first and second trenches;
        planarizing the insulator until upper surfaces of the first conductive layer patterns are exposed;
        forming a mask pattern to close the second trench; and
        recessing the insulator gap-filling the first trench by using the mask pattern as an etching barrier.

* * * * *